(12) United States Patent
Chen et al.

(10) Patent No.: US 7,843,012 B2
(45) Date of Patent: Nov. 30, 2010

(54) CMOS TRANSISTOR

(75) Inventors: Ming-I Chen, Hsinchu (TW); Fang-Mei Chao, Taipei County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 446 days.

(21) Appl. No.: 11/669,905

(22) Filed: Jan. 31, 2007

(65) Prior Publication Data

US 2008/0179686 A1    Jul. 31, 2008

(51) Int. Cl.
*H01L 27/092* (2006.01)

(52) U.S. Cl. .................. 257/371; 257/E21.633

(58) Field of Classification Search ............... 257/369, 257/E21.633, 371, 327
See application file for complete search history.

(56) References Cited

U.S. PATENT DOCUMENTS

2005/0035382 A1* 2/2005 Shinohara et al. ........... 257/290

* cited by examiner

*Primary Examiner*—Lynne A Gurley
*Assistant Examiner*—Colleen A Matthews
(74) *Attorney, Agent, or Firm*—Winston Hsu; Scott Margo

(57) ABSTRACT

The CMOS transistor of the present invention includes deep halo doped regions in the substrate, which can avoid the occurrence of latch-up. In addition, the fabrication of the deep halo doped regions is integrated into the process of making the lightly doped drains or the source/drain doped regions, and therefore no extra mask is required.

4 Claims, 19 Drawing Sheets

CMOS TRANSISTOR

BACKGROUND OF THE INVENTION

1. Field of the Invention

The present invention relates to a CMOS transistor and method of making the same, and more particularly, to a CMOS transistor having improved latch-up robustness and method of making the same.

2. Description of the Prior Art

Complementary Metal-Oxide Semiconductor (CMOS) transistor is composed of an NMOS transistor and a PMOS transistor. Please refer to FIG. 1. FIG. 1 is a schematic diagram illustrating a conventional CMOS transistor. As shown in FIG. 1, the CMOS transistor has a P type substrate 10, which includes a PMOS region 20 and an NMOS region 40 while viewed from top. The PMOS region 20 and the NMOS region 40 are isolated from each other by isolation structures 12. The PMOS region 20 includes an N well 22 disposed in the substrate 10, a gate dielectric layer 24 disposed on the surface of the substrate 10, a gate electrode 26 on the surface of the gate dielectric layer 24, two spacers 28 disposed alongside the gate electrode 26, and two P type source/drain doped regions 30 respectively disposed in the substrate 10 by both sides of the spacers 28. In addition, two lightly doped drains (LDD) 32 are disposed in the substrate 10 under the spacers 28, and two lightly doped pocket doped regions (also referred to as halo doped regions) 34 are positioned under the lightly doped drains 32.

The NMOS region 40 includes a P well 42 disposed in the substrate 10, a gate dielectric layer 44 disposed on the surface of the substrate 10, a gate electrode 46 disposed on the surface of the gate dielectric layer 44, two spacers 48 disposed alongside the gate electrode 46, two N type source/drain doped region 50 respectively disposed in the substrate 10 by both sides of the spacers 48. In addition, two lightly doped drains (LDD) 52 are disposed in the substrate 10 under the spacers 48.

The CMOS transistor has been widely used as a primary basic electronic device, however, latch-up phenomenon may occur when critical dimension improves if the PMOS transistor and the NMOS transistor are not well isolated. In addition, for some high current or high voltage ICs, e.g. analogue ICs or power management ICs (PMICs), latch-up is a critical issue to be improved.

Please refer to FIGS. 2-3, and FIG. 1 as well. FIG. 2 is a schematic diagram of a pnpn diode, and FIG. 3 is a current vs. voltage relation chart of a pnpn diode shown in FIG. 2. As shown in FIG. 1, the CMOS transistor is configured as an inverter for the purpose of testing latch-up. The P type source/drain doped region 30, the n well 22, and the P type substrate 10 in the PMOS device region 20 act as a vertical pnp bipolar junction transistor. On the other hand, the N type source/drain 50 and the p well 42 of the NMOS device region 40, and the n well 22 of the PMOS device region 20 act as a lateral npn bipolar junction transistor. Since the base of the vertical pnp bipolar junction transistor and the collector of the lateral npn bipolar junction transistor are electrically coupled, and the collector of the vertical pnp transistor and the base of the lateral npn bipolar junction transistor are electrically coupled, the base of any one bipolar junction transistor is driven by the other bipolar junction transistor. As a result, the vertical pnp bipolar junction transistor and the lateral npn transistor form a positive feedback loop.

The positive feedback loop can be regarded as a parasitic pnpn diode as shown in FIG. 2, and the current vs. voltage operational curve is shown in FIG. 3. The triggering current is $I_H$, and when the current is greater than the triggering current $I_H$, the pnpn diode is in an "on" state. Accordingly, latch-up will occur to the CMOS transistor. Once latch-up happens, the CMOS transistor will temporarily or even permanently fail. Therefore, it is a crucial issue to prevent latch-up in CMOS designs and fabrications.

SUMMARY OF THE INVENTION

It is therefore one of the objective of the claimed invention to provide a method of fabricating CMOS transistor to improve the latch-up robustness.

It is another objective of the claimed invention to provide a CMOS transistor with improved latch-up robustness.

According to an embodiment of the claimed invention, a method of fabricating CMOS transistor is disclosed. First, a substrate comprising a first conductive type MOS device region and a second conductive type MOS device region is provided. The substrate further includes a second conductive type well disposed in the first conductive type MOS device region, and a first conductive type well disposed in the second conductive type MOS device region. Subsequently, a plurality isolation structures on the surface of the substrate are formed, and a gate structure is formed in the first conductive type MOS device region. Then, a first mask pattern exposing the gate structure of the first conductive type MOS device region and the substrate disposed by both side of the gate structure of the first conductive type MOS device region is formed on the surface of the substrate. Following that, two lightly doped drains are formed in the second conductive type well by both sides of the gate structure in the first conductive type MOS device region by implanting using the first mask pattern, and two second conductive type deep halo doped regions are formed in the second conductive type well by both sides of the gate structure in the first conductive type MOS device region by implanting using the first mask pattern. Thereafter, the first mask pattern is removed, and spacers are formed along both sides of the gate structure in the first conductive type MOS device region and along both sides of the gate structure in the second conductive type MOS device region. After that, a second mask pattern exposing the gate structure of the first conductive type MOS device region and the substrate disposed by both sides of the spacers of the gate structure in the first conductive type MOS device region is formed on the surface of the substrate. Subsequently, two source/drain doped regions are formed in the second conductive type well by both sides of the spacers of the gate structure in the first conductive type MOS device region by implanting using the second mask pattern, and the second mask pattern is removed.

The method of the present invention forms the deep halo doped regions along with the lightly doped drains with the same mask pattern. As a result, the latch-up robustness is improved without using extra mask.

These and other objectives of the present invention will no doubt become obvious to those of ordinary skill in the art after reading the following detailed description of the preferred embodiment that is illustrated in the various figures and drawings.

DETAILED DESCRIPTION

Figure 4:
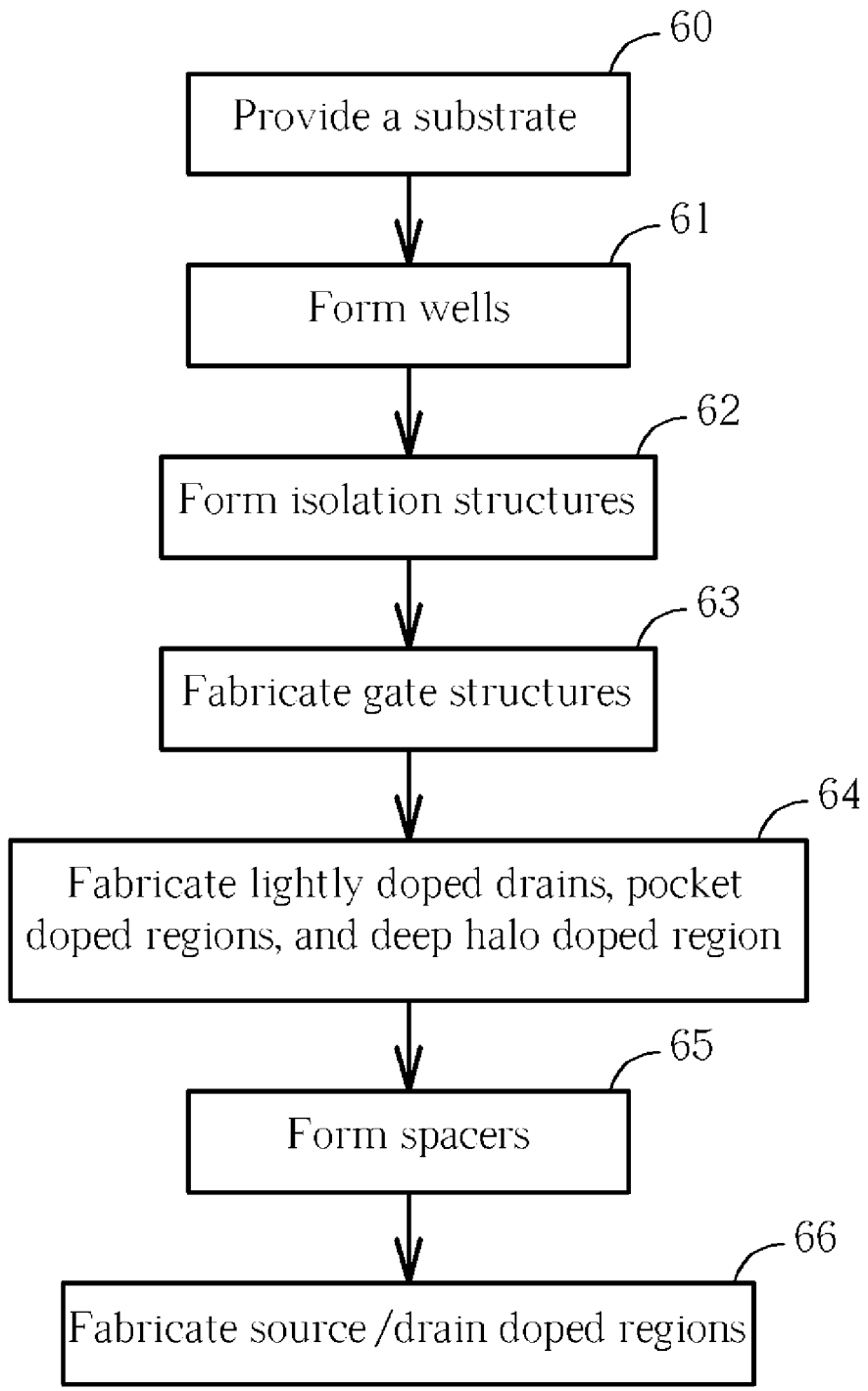
FIG. 4 is a flow chart of a method of fabricating CMOS transistor in accordance with a first preferred embodiment of the present invention.

Please refer to FIG. 4. FIG. 4 is a flow chart of a method of fabricating CMOS transistor in accordance with a first preferred embodiment of the present invention. As shown in FIG. 4, the method of this embodiment includes the following main steps.

Step 60: provide a substrate;

Step 61: form wells;

Step 62: form isolation structures;

Step 63: fabricate gate structures;

Step 64: fabricate lightly doped drains, pocket doped regions, and deep halo doped region;

Step 65: form spacers; and

Step 66: fabricate source/drain doped regions.

Figure 5:
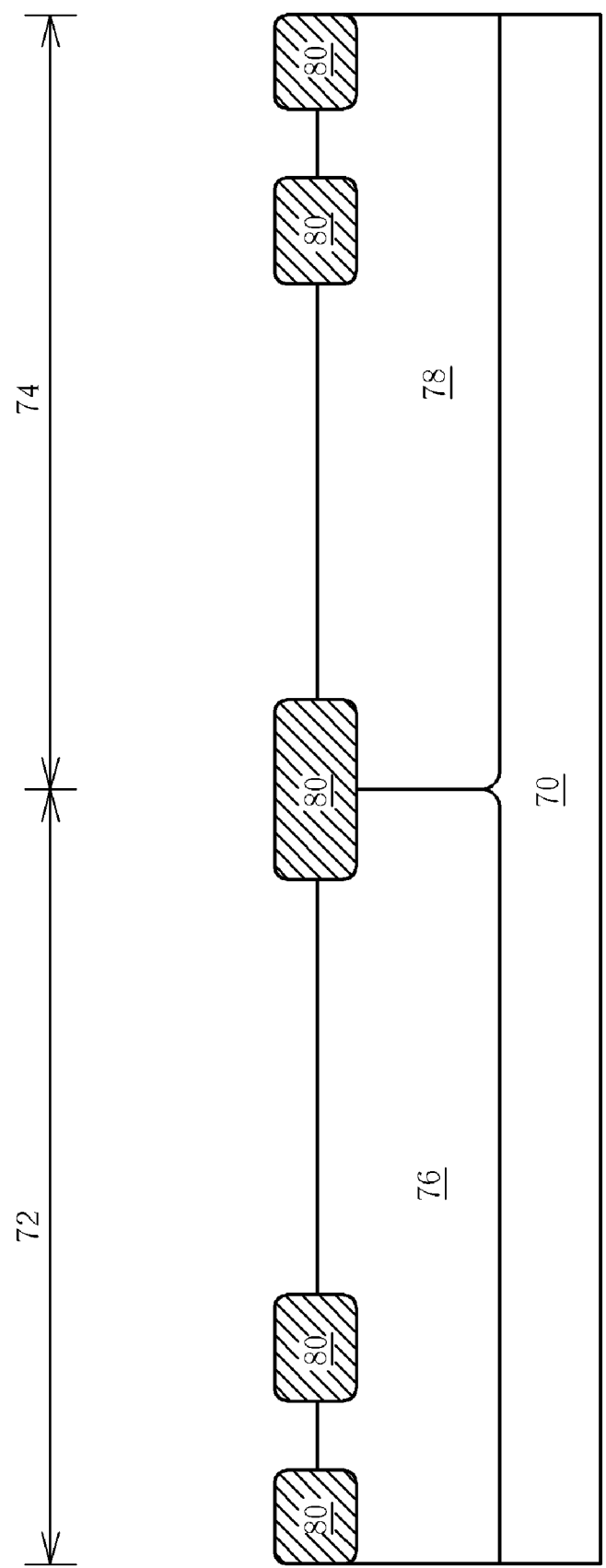
FIGS. 5-11 are schematic diagrams illustrating the method of fabricating CMOS transistor of the first preferred embodiment of the present invention.

Refer to FIGS. 5-11. FIGS. 5-11 are schematic diagrams illustrating the method of fabricating CMOS transistor of the first preferred embodiment of the present invention. In the following embodiments of the present invention, the first conductive type is P type, and the second conductive type is N type. Nevertheless, the first conductive type can also be N type, and the second conductive type can be P type in other configurations. As shown in FIG. 5, a P type substrate 70 is provided. The substrate 70 includes a PMOS device region 72 and an NMOS device region 74 when viewed from top. Then, an n well 76 is formed in the PMOS device region 72, and a p well 78 is formed in the NMOS device region 74. Subsequently, isolation structures 80 such as field oxide (FOX) or shallow trench isolation (STI) are formed in the substrate 70.

Figure 6:
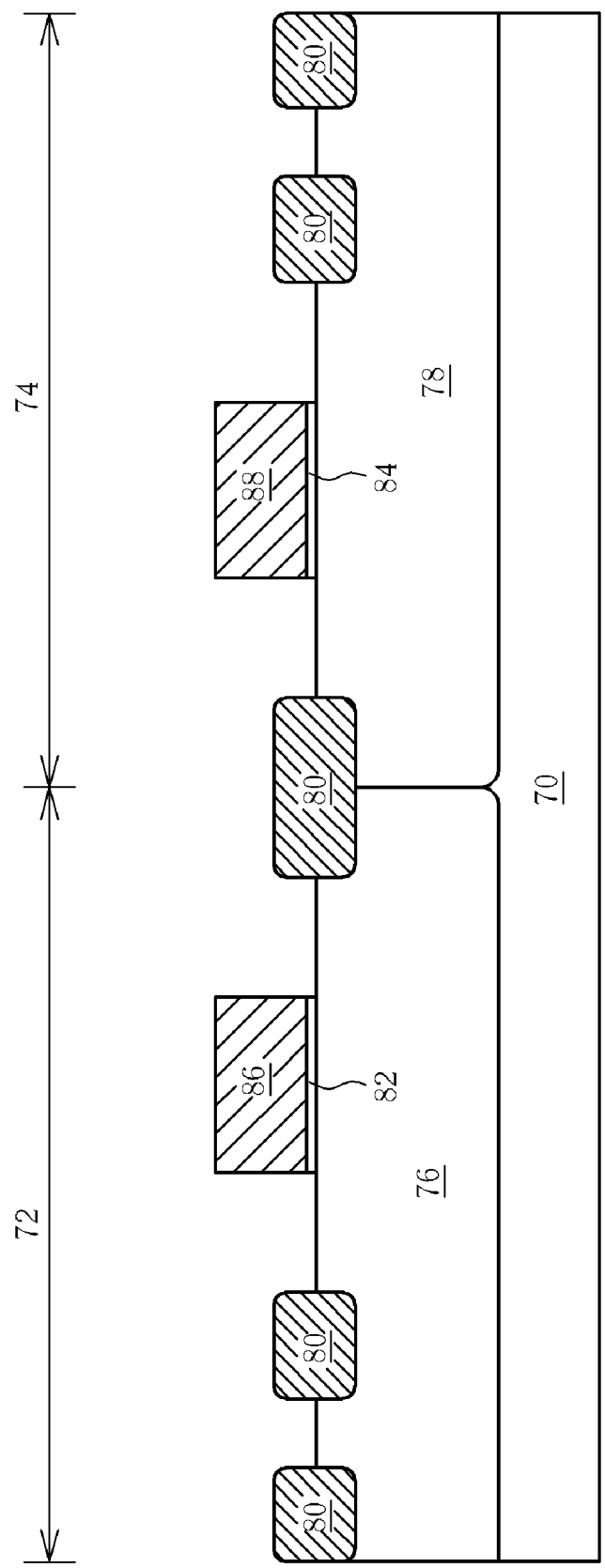

As shown in FIG. 6, a dielectric layer e.g. a silicon oxide layer, and a conductive layer e.g. a polycrystalline silicon layer are consecutively deposited on the surface of the substrate 70, and lithography and etching techniques are used to form a gate dielectric layer 82 and a gate electrode 86 in the PMOS device region 72, and a gate dielectric layer 84 and a gate electrode 88 in the NMOS device region 74.

Figure 7:
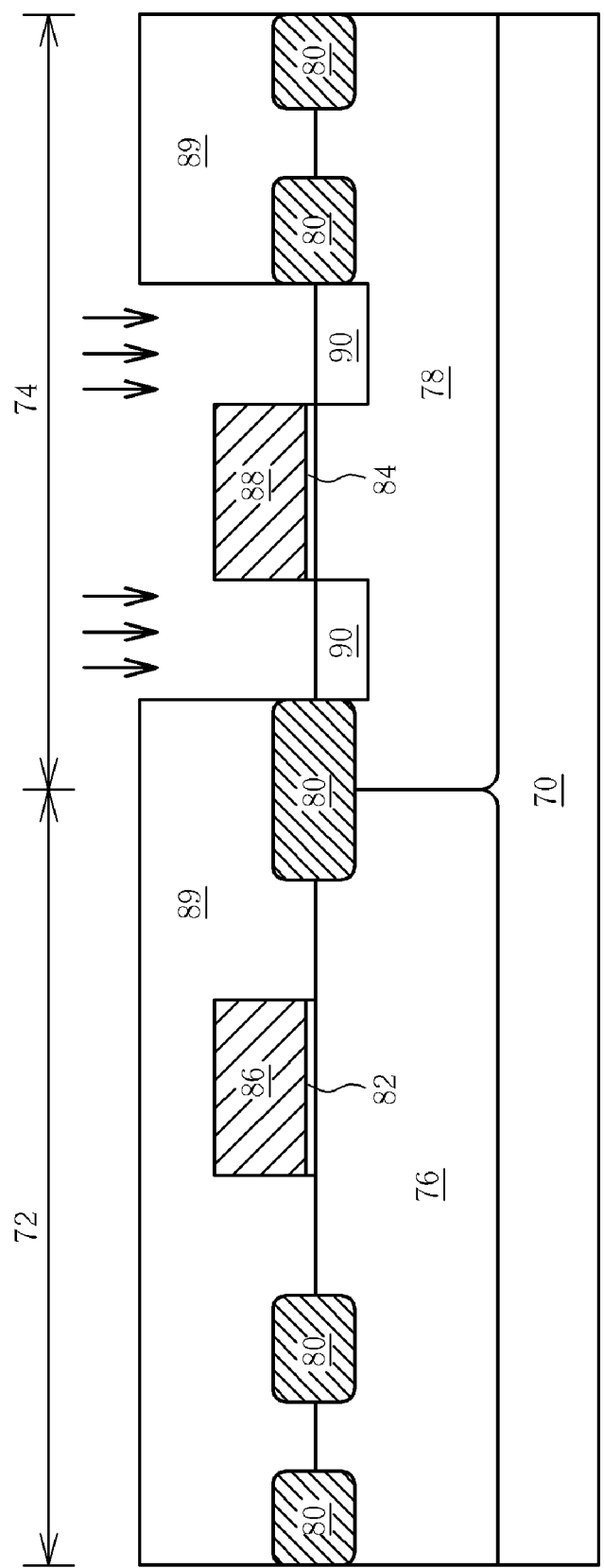

As shown in FIG. 7, a mask pattern 89 is used to block the surface of the NMOS device region 74 and a portion of the PMOS device region 72. The substrate 70 disposed by both sides of the gate electrode 88 of the NMOS device region 74 is implanted to form two lightly doped drains 90, and the mask pattern 89 is then removed.

Figure 8:
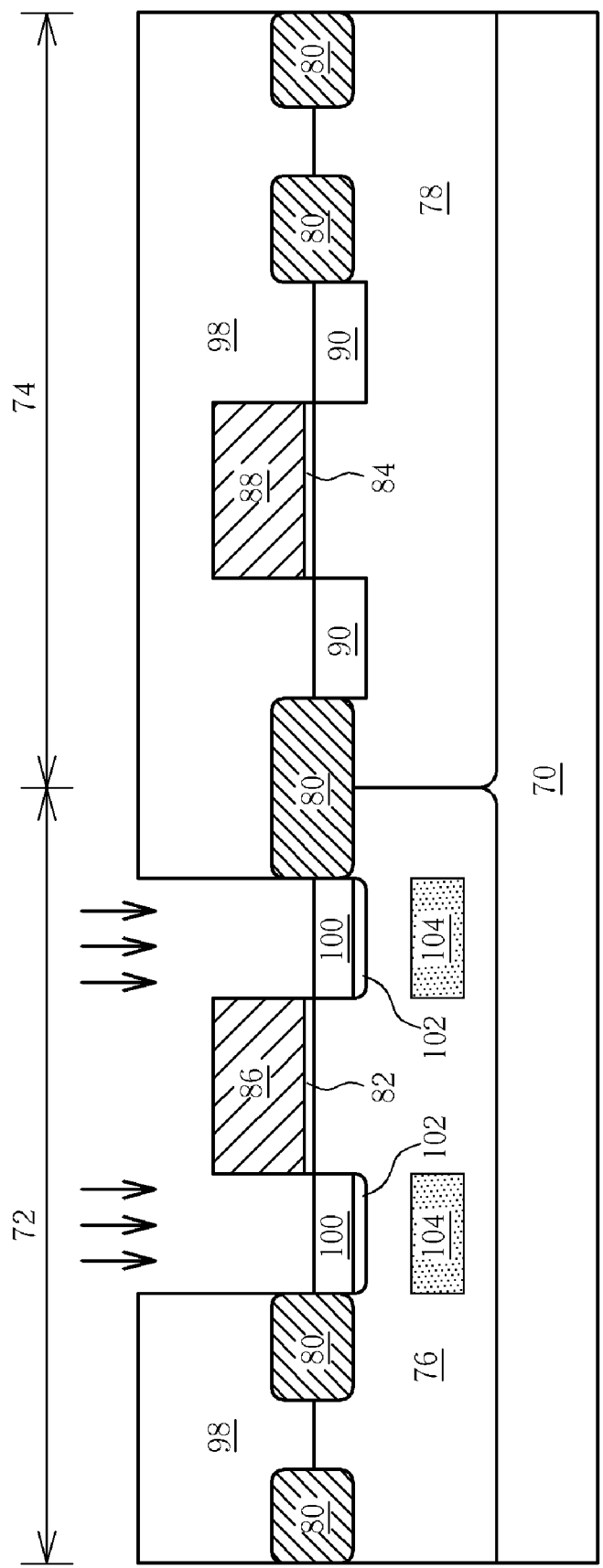

As shown in FIG. 8, a first mask pattern 98 e.g. a photoresist pattern is formed on the surface of the substrate 70. The first mask pattern 98 blocks the NMOS device region 74, and a portion of the PMOS device region 72, while the gate electrode 86 and the substrate 70 disposed by both sides of the gate electrode 86 of the PMOS device region 72 are exposed. Subsequently, the first mask pattern 98 is used as a mask to implant the substrate 70 for forming two lightly doped P type (P−) lightly doped drains 100, and two lightly doped N type (N−) pocket doped regions 102 in the n well 76 of the PMOS device region 72. The same first mask pattern 98 is used to implant the substrate 70 disposed by both sides of the gate electrode 86 of the PMOS device region 72 to form two heavily doped N type (N+) deep halo doped regions 104 in the n well 76.

The lightly doped drains 100, the pocket doped regions 102, and the deep halo doped regions 104 are formed in the n well 76 in different implantation processes along with one or several anneal process, but with the same first mask pattern 98. It is appreciated that the sequence of forming lightly doped drains 100, the pocket doped regions 102, and the deep halo doped regions 104 is not limited to the order of this embodiment, but can be switched where necessary. The deep halo doped region 104 is formed by a high-energy and high-dosage implantation process so that the deep halo doped region 104 is positioned under and corresponding to the pocket doped region 102 and the lightly doped drains 100. In this embodiment, the implanting energy of the deep halo doped regions 104 is substantially between 150 and 180 kev, and the implanting concentration of the deep halo doped regions 104 is substantially between $10^{13}$ and $10^{14}$ atoms/$cm^3$. The implanting energy and concentration are not limited to be in the aforementioned ranges, and can be modified. The deep halo doped regions 104 can increase the base width of the vertical pnp bipolar junction transistor, and reduce the beta gain thereof. Therefore, latch-up can be avoided.

Figure 9:
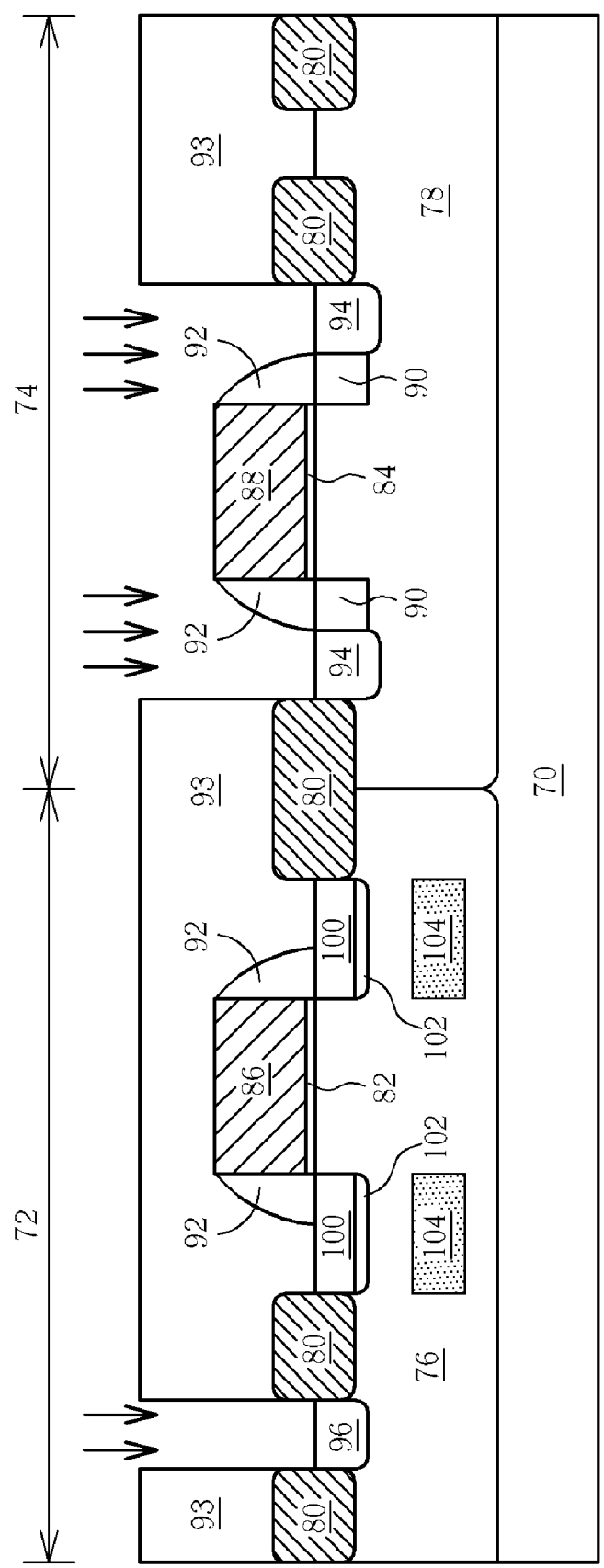

As shown in FIG. 9, the first mask pattern 98 is removed, and spacers 92 are formed alongside the gate electrode 86 in the PMOS device region 72 and alongside the gate electrode 88 in the NMOS device region 74. Then, a mask pattern 93 is used to block a portion of the PMOS device region 72 and a portion of the NMOS device region 74. Subsequently, an implantation process is performed to form two source/drain doped regions 94 in the substrate 70 by both sides of the spacers 92 in the NMOS device region 74, and to form an n type doped region (pick up region) 96 used to connect to the n well 76 in the PMOS device region 72 as well. The mask pattern 93 is then removed.

Figure 1:
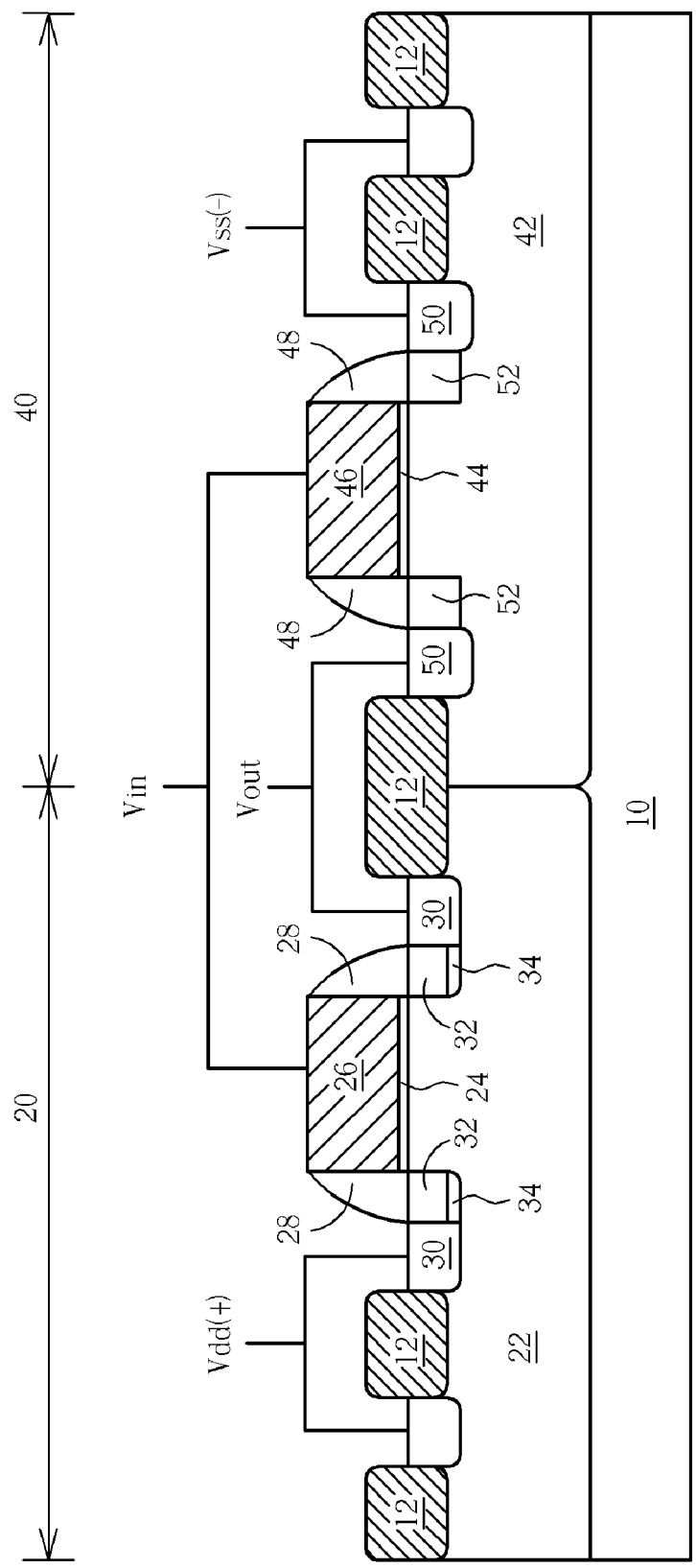
FIG. 1 is a schematic diagram illustrating a conventional CMOS transistor.
Figure 2:
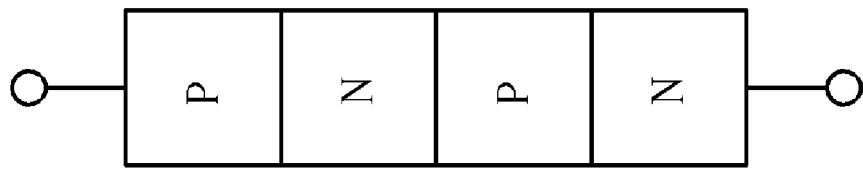
FIG. 2 is a schematic diagram of a pnpn diode.
Figure 3:
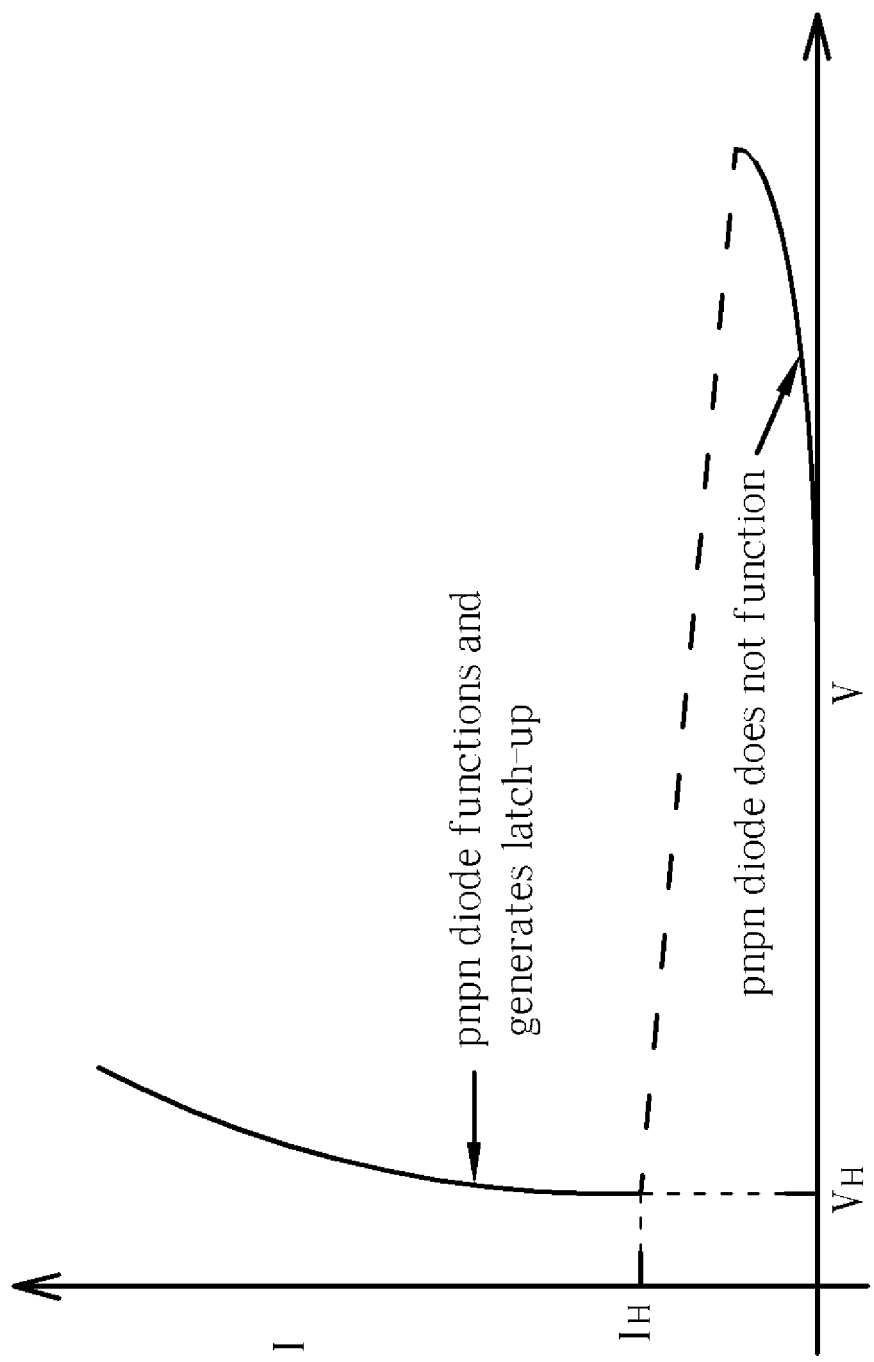
FIG. 3 is a current vs. voltage relation chart of a pnpn diode shown in FIG. 2.
Figure 10:
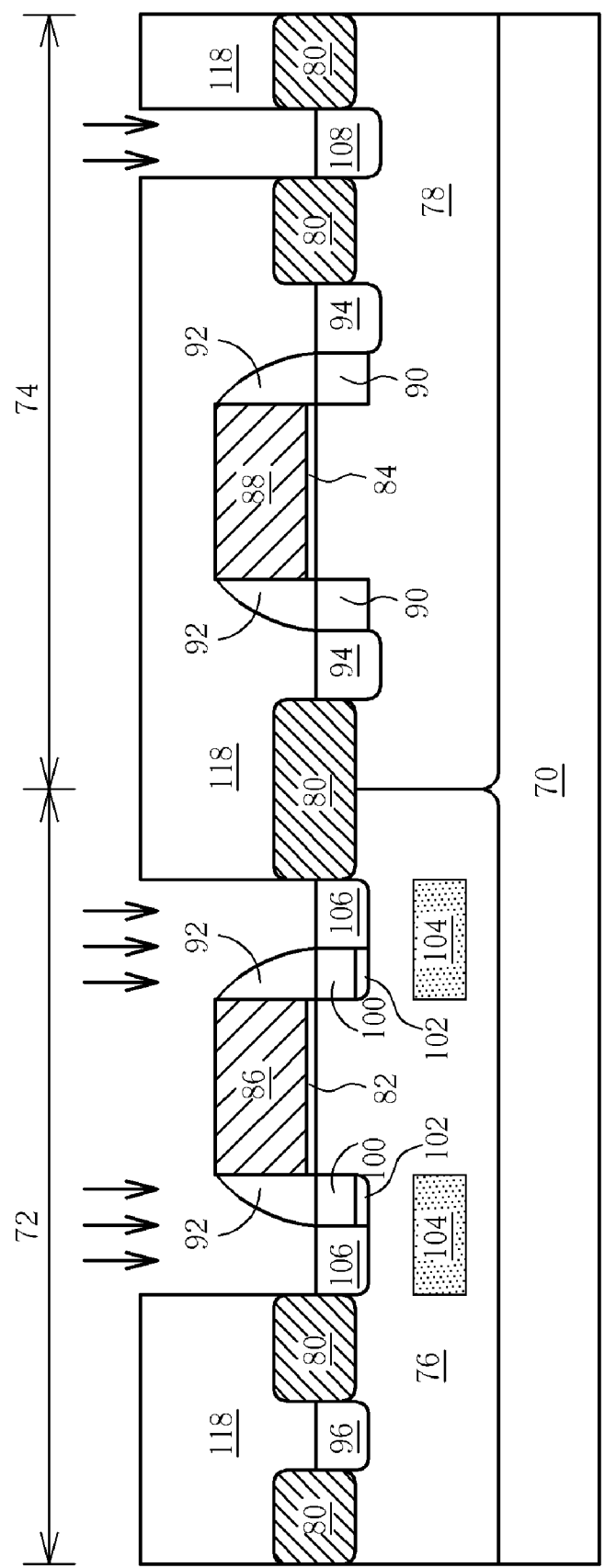
Figure 11:
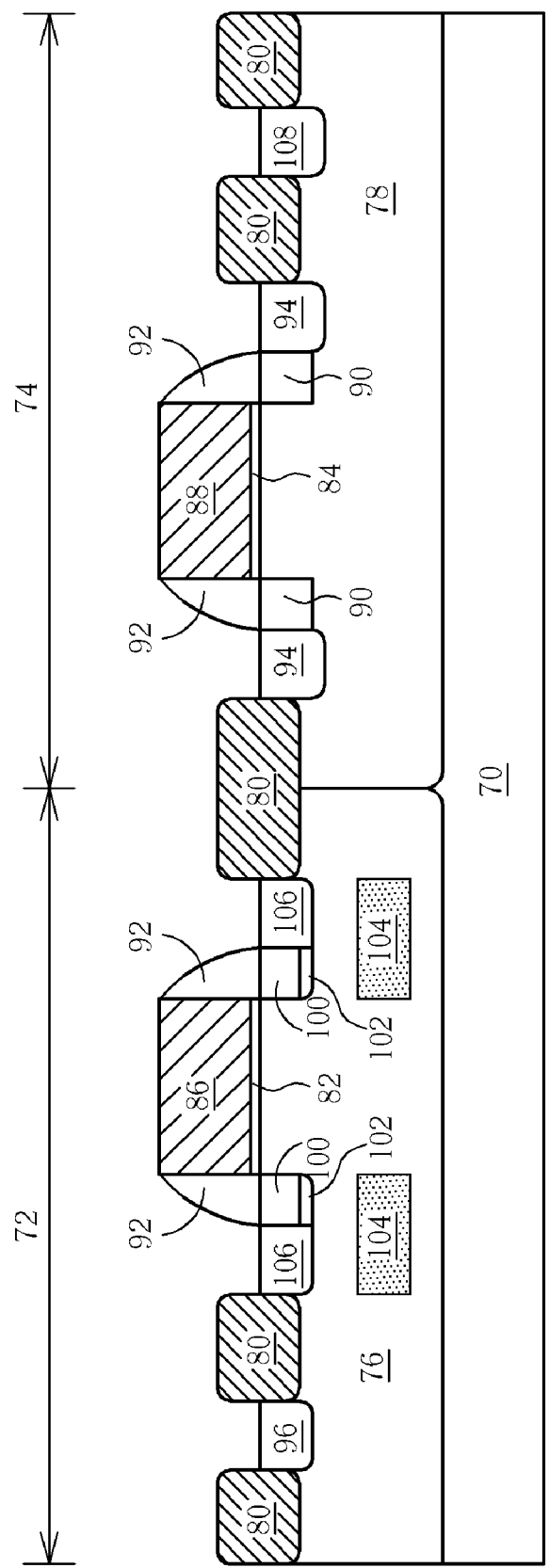

As shown in FIG. 10, a second mask pattern 118 is formed on the surface of the substrate 70. The second mask pattern 118 blocks a portion of the PMOS device region 72 and a portion of the NMOS device region 74. An implantation process is then performed to form two source/drain doped regions 106 in the substrate 70 by both sides of the spacers 92 in the PMOS device region 72, and a p type doped region (pick up region) 108 used to connect to the p well 78 in the NMOS device region 74 as well. As shown in FIG. 1, the second mask pattern 118 is then removed.

It can be seen that the deep halo doped region 104, the pocket doped region 102, and the lightly doped drains 100 are formed with the same first mask pattern 98, and therefore no extra mask is required.

Figure 12:
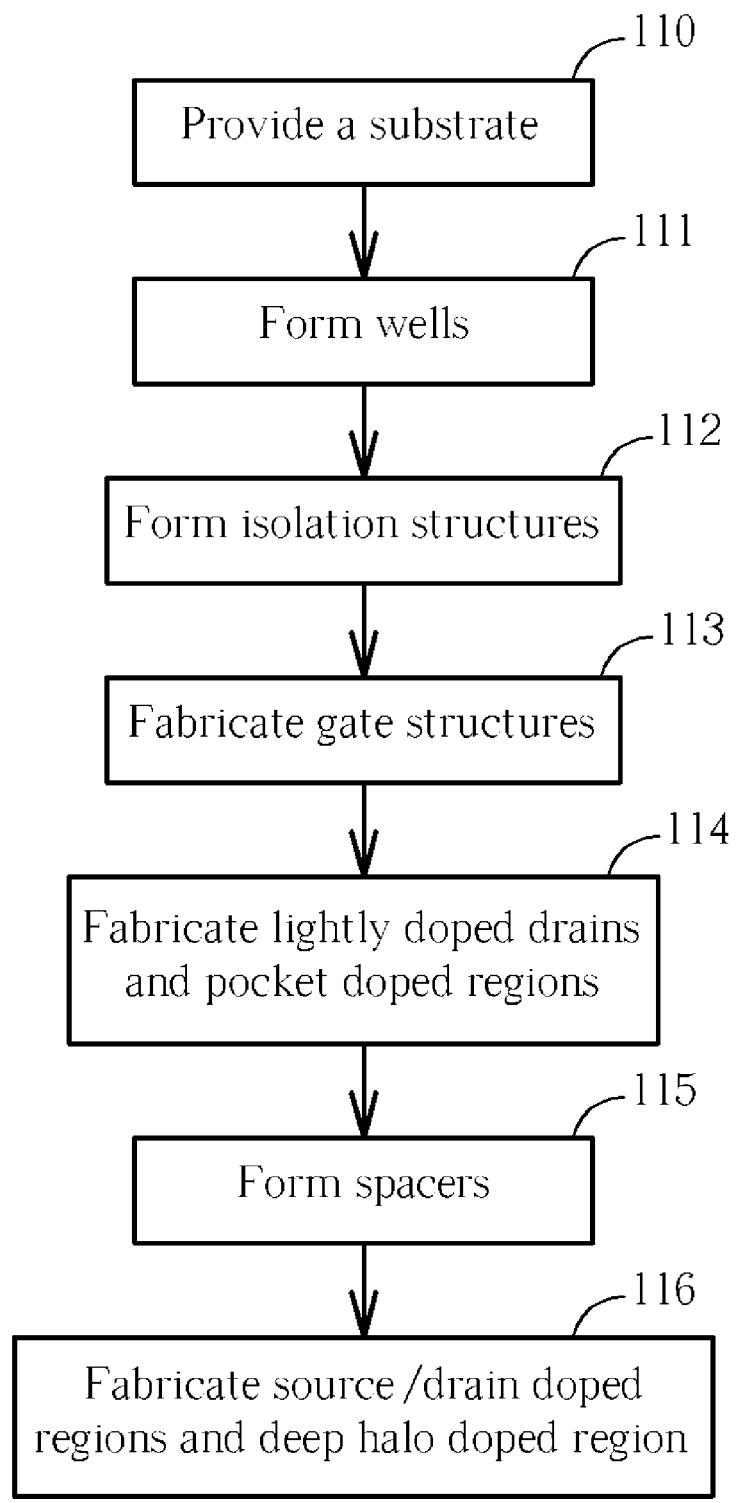
FIG. 12 is a flow chart of a method of fabricating CMOS transistor in accordance with a second preferred embodiment of the present invention.

Please refer to FIG. 12. FIG. 12 is a flow chart of a method of fabricating CMOS transistor in accordance with a second preferred embodiment of the present invention. As shown in FIG. 12, the method of this embodiment includes the following main steps:

Step 110: provide a substrate;

Step 111: form wells;

Step 112: form isolation structures;

Step 113: fabricate gate structures;

Step 114: fabricate lightly doped drains and pocket doped regions;

Step 115: form spacers; and

Step 116: fabricate source/drain doped regions and deep halo doped region.

Figure 13:
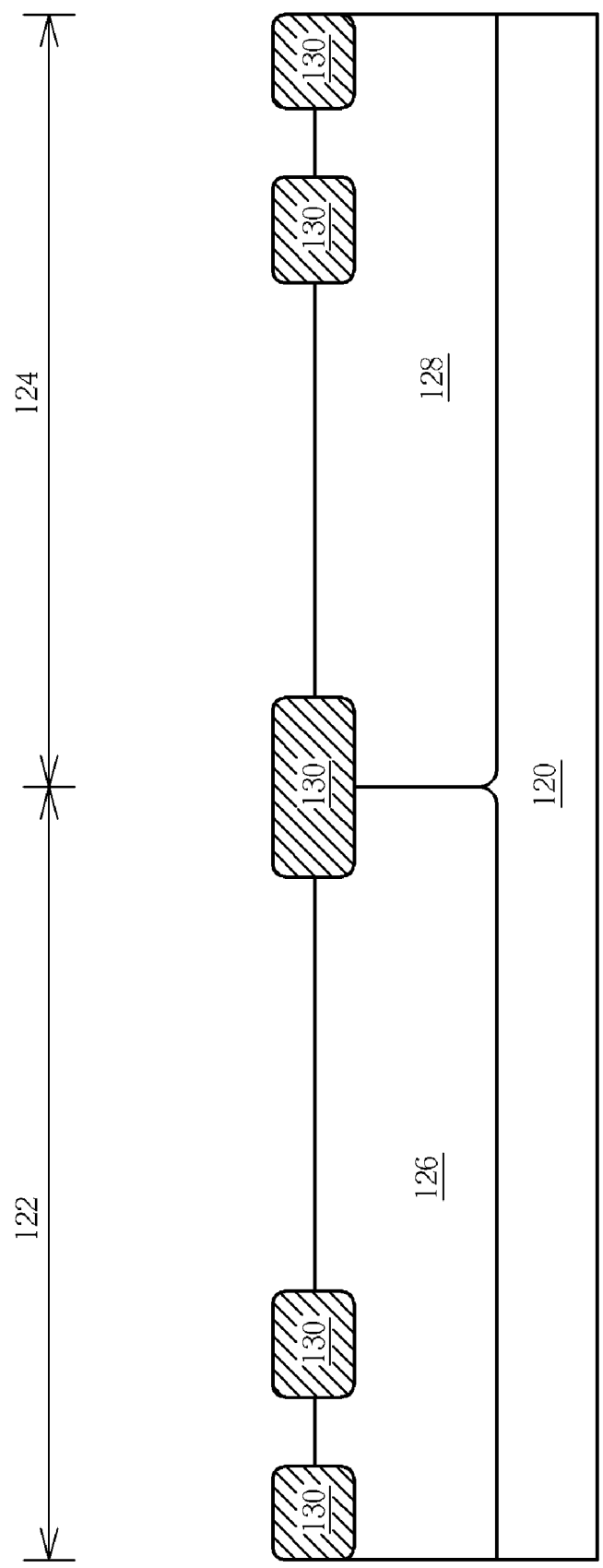
FIGS. 13-19 are schematic diagrams illustrating the method of fabricating CMOS transistor of the second preferred embodiment of the present invention.

Refer to FIGS. 13-19. FIGS. 13-19 are schematic diagrams illustrating the method of fabricating CMOS transistor of the second preferred embodiment of the present invention. In the following embodiments of the present invention, the first conductive type is P type, and the second conductive type is N type. Nevertheless, the first conductive type can also be N type, and the second conductive type can be P type in other configurations. As shown in FIG. 13, a P type substrate 120 is provided. The substrate 120 includes a PMOS device region 122 and an NMOS device region 124 when viewed from top. Then, an n well 126 is formed in the PMOS device region 122, and a p well 128 is formed in the NMOS device region 124. Subsequently, isolation structures 130 such as field oxide (FOX) or shallow trench isolation (STI) are formed in the substrate 120.

Figure 14:
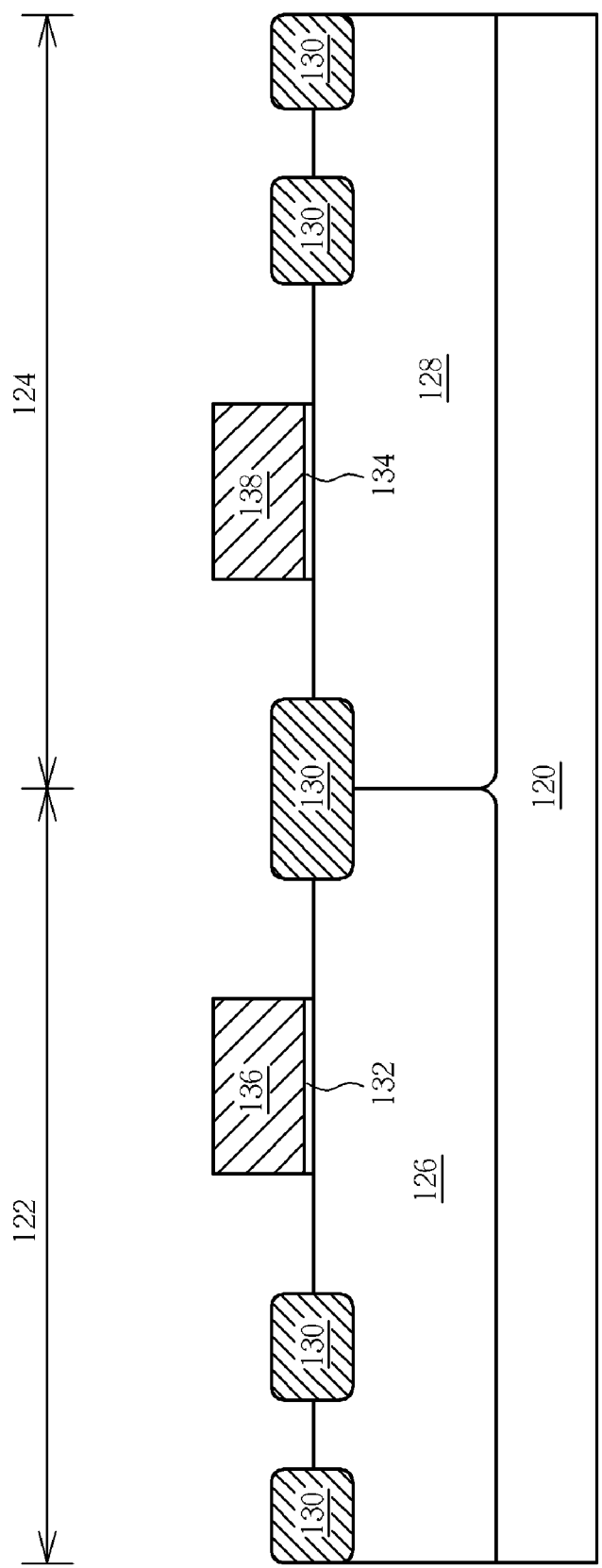

As shown in FIG. 14, a dielectric layer e.g. a silicon oxide layer, and a conductive layer e.g. a polycrystalline silicon layer are consecutively deposited on the surface of the substrate 120, and lithography and etching techniques are used to form a gate dielectric layer 132 and a gate electrode 136 in the PMOS device region 122, and a gate dielectric layer 134 and a gate electrode 138 in the NMOS device region 124.

Figure 15:
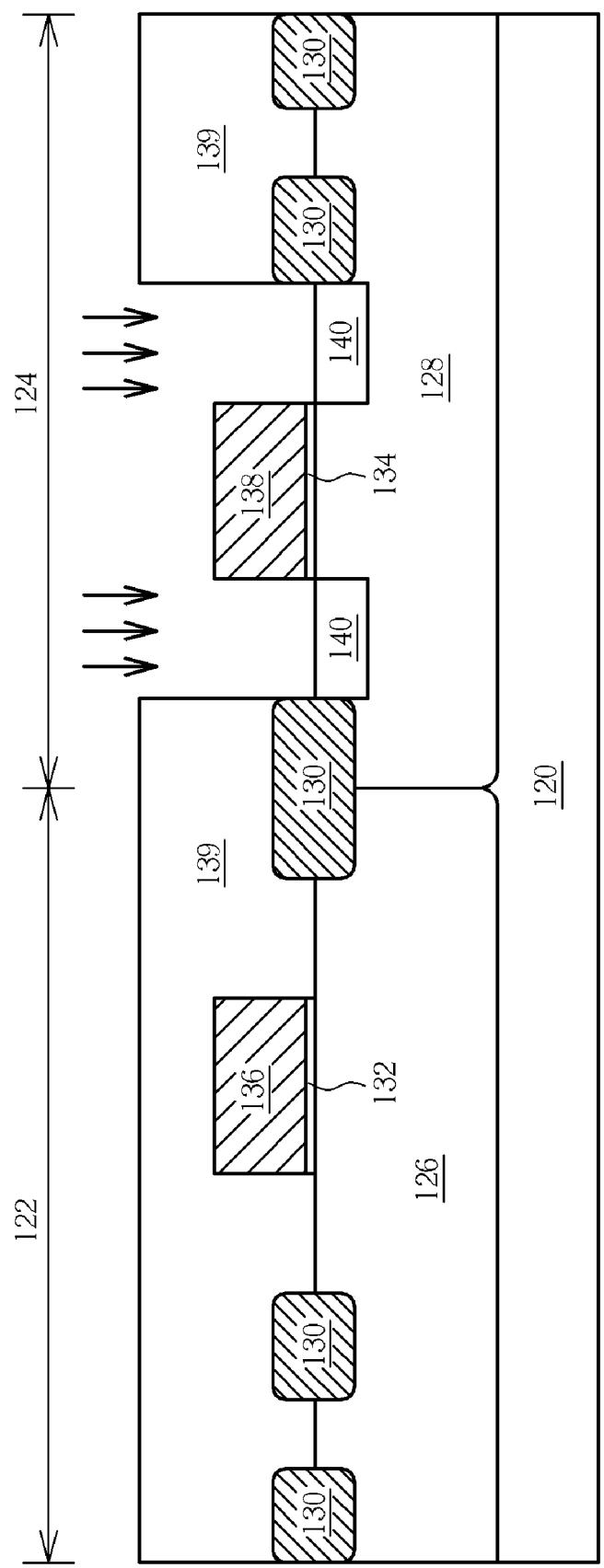

As shown in FIG. 15, a mask pattern 139 is used to block the surface of the NMOS device region 124 and a portion of the PMOS device region 122. The substrate 120 disposed by both sides of the gate electrode 138 of the NMOS device region 124 is implanted to form two lightly doped drains 140, and the mask pattern 139 is then removed.

Figure 16:
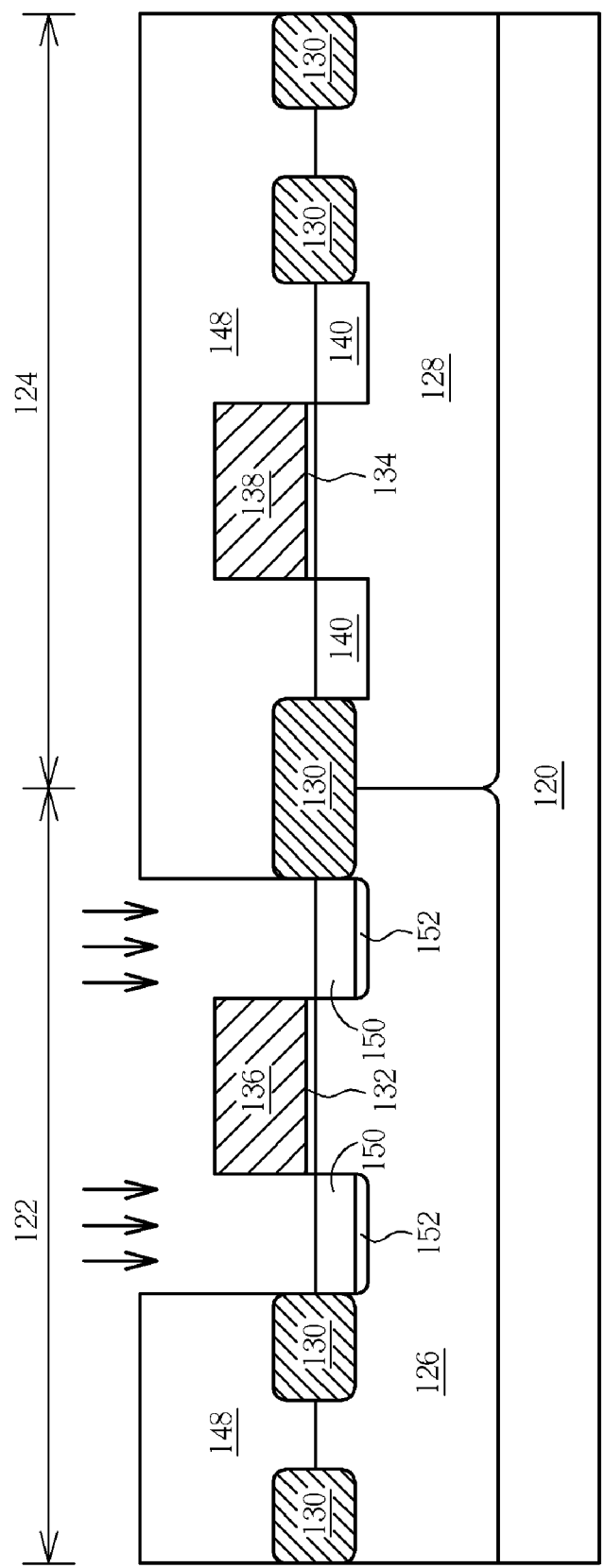

As shown in FIG. 16, a first mask pattern 148 e.g. a photoresist pattern is formed on the surface of the substrate 120. The first mask pattern 148 blocks the NMOS device region 124, and a portion of the PMOS device region 122, while the gate electrode 136 and the substrate 120 disposed by both sides of the gate electrode 136 of the PMOS device region 122 are exposed. Subsequently, the first mask pattern 148 is used as a mask to implant the substrate 120 for forming two lightly doped P type (P−) lightly doped drains 150, and two lightly doped N type (N−) pocket doped regions 152 in the n well 126 of the PMOS device region 122.

Figure 17:
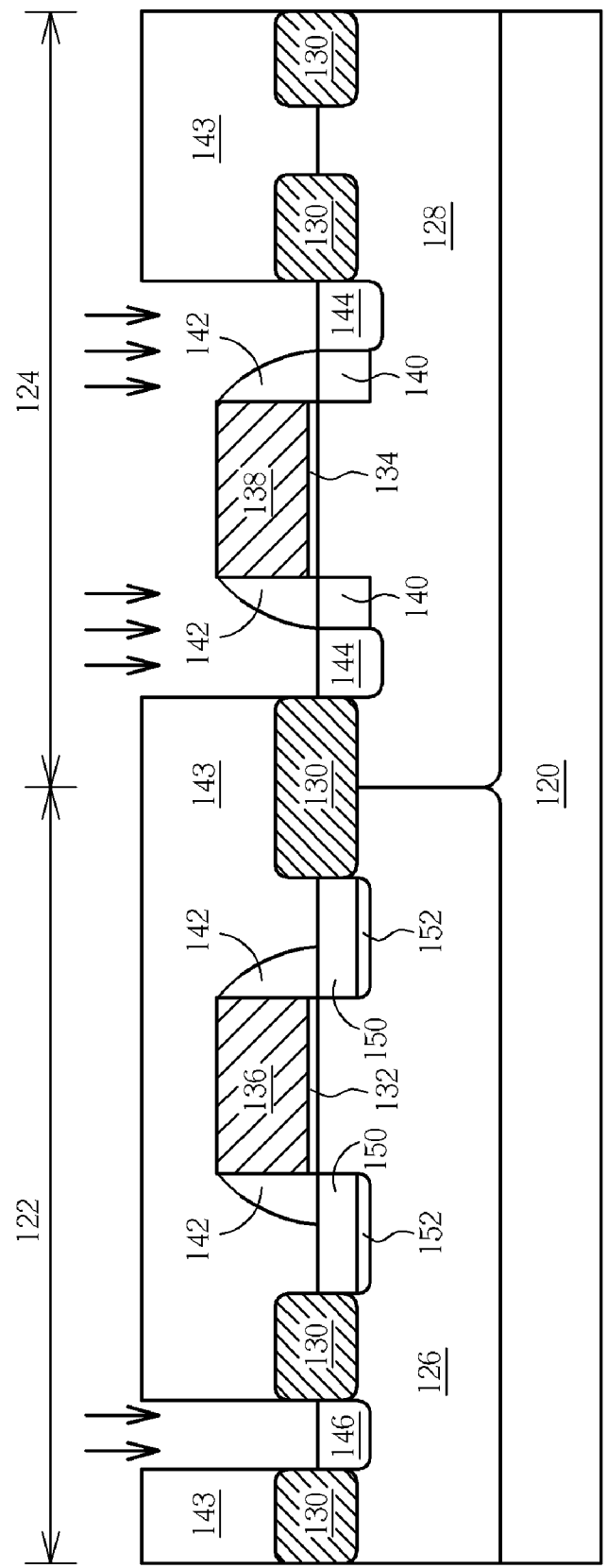

As shown in FIG. 17, the first mask pattern 148 is removed, and spacers 142 are formed alongside the gate electrode 136 in the PMOS device region 122 and alongside the gate electrode 138 in the NMOS device region 124. Then, a mask pattern 143 is used to block a portion of the PMOS device region 122 and a portion of the NMOS device region 124. Subsequently, an implantation process is performed to form two source/drain doped regions 144 in the substrate 120 by both sides of the spacers 142 in the NMOS device region 124, and to form an n type doped region (pick up region) 146 used to connect to the n well 126 in the PMOS device region 122 as well. The mask pattern 143 is then removed.

Figure 18:
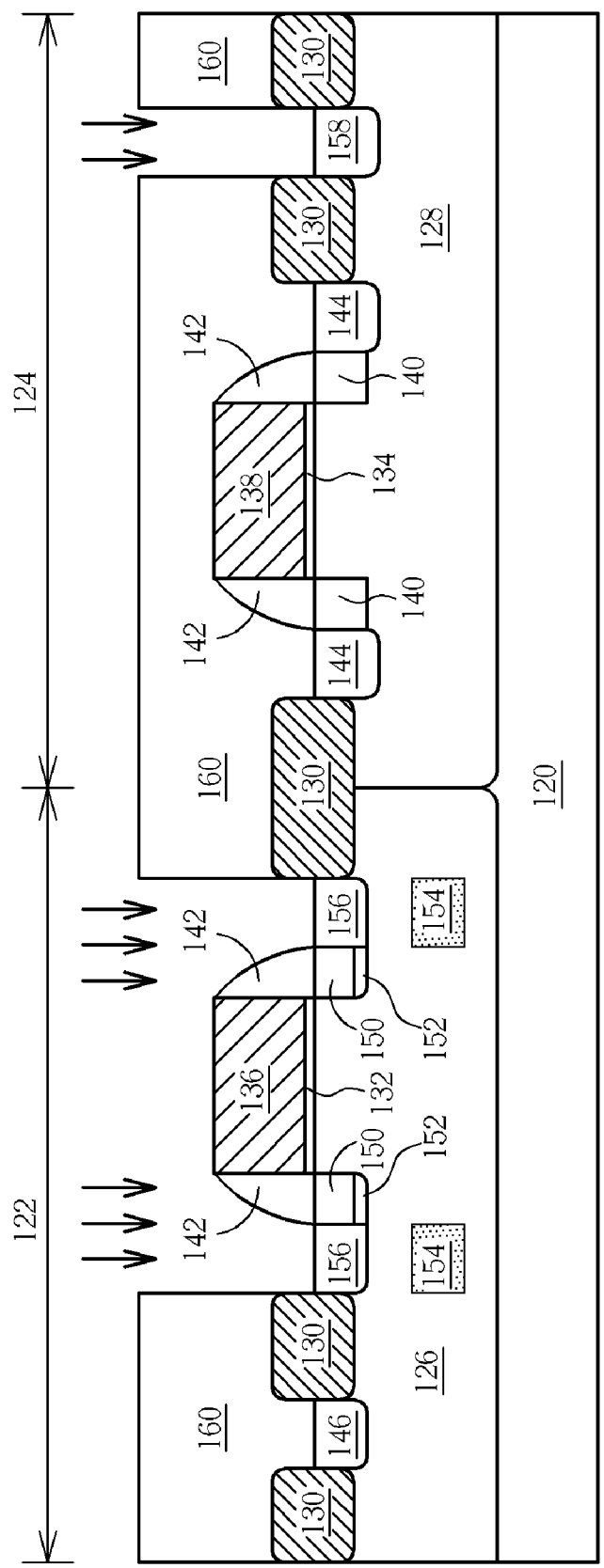

As shown in FIG. 18, a second mask pattern 160 is formed on the surface of the substrate 120. The second mask pattern 160 blocks a portion of the PMOS device region 122 and a portion of the NMOS device region 124. An implantation process is then performed to form two source/drain doped regions 156 in the substrate 120 by both sides of the spacers 142 in the PMOS device region 122, and a p type doped region (pick up region) 158 used to connect to the p well 128 in the NMOS device region 124 as well.

Figure 19:
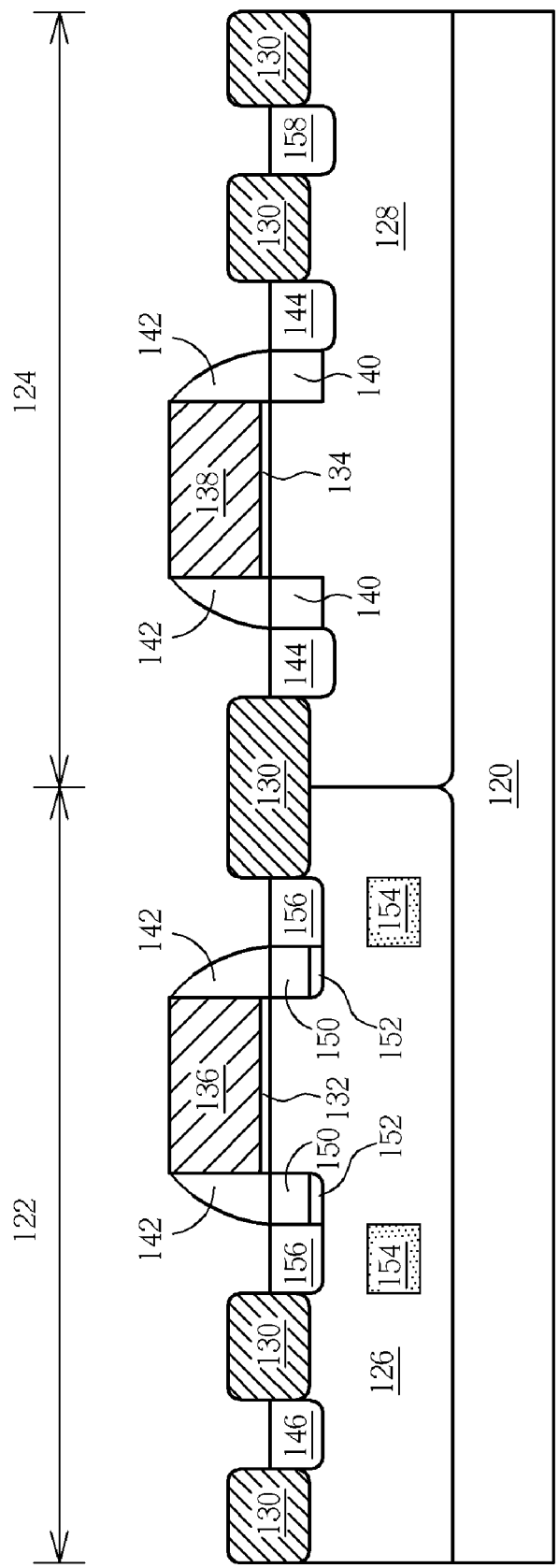

The deep halo doped regions 154 and the source/drain doped regions 156 are formed in the n well 126 in different implantation processes, but with the same second mask pattern 160. It is appreciated that the sequence of forming the deep halo doped regions 154 and the source/drain doped region 156 is not limited to the order of this embodiment, but can be switched where necessary. The deep halo doped region 154 is formed by a high-energy and high-dosage implantation process so that the deep halo doped region 154 is positioned under and corresponding to the source/drain doped region 156. In this embodiment, the implanting energy of the deep halo doped regions 154 is substantially between 150 and 180 kev, and the implanting concentration of the deep halo doped regions 154 is substantially between $10^{13}$ and $10^{14}$ atoms/$cm^3$. However, the implanting energy and concentration are not limited to be in the aforementioned ranges, and can be modified. The deep halo doped regions 154 can increase the base width of the vertical pnp bipolar junction transistor, and reduce the beta gain thereof. Therefore, latch-up can be avoided. As shown in FIG. 19, the second mask pattern 160 is then removed.

It can be seen that the deep halo doped region 154 and the source/drain doped region 156 are formed with the same second mask pattern 160, and therefore no extra mask is required.

In summary, the deep halo doped regions is able to increase the base width of the vertical pnp bipolar junction transistor, and reduce the beta gain. Therefore, latch-up can be avoided. In addition, the fabrication of the deep halo doped regions is integrated into the process of making the lightly doped drains or the source/drain doped regions, and therefore no extra mask is required.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A CMOS transistor, comprising:
   a substrate comprising a first conductive type MOS device region and a second conductive type MOS device region, the substrate further comprising a second conductive type well disposed in the first conductive type MOS device region, and a first conductive type well disposed in the second conductive type MOS device region;
   a plurality isolation structures disposed on the surface of the substrate;
   a gate structure disposed in the first conductive type MOS device region, and spacers disposed alongside the gate structure;
   two source/drain doped regions disposed in the second conductive type well by both sides of the spacers of the gate structure in the first conductive type MOS device region;
   two lightly doped drains disposed in the second conductive type well by both sides of the gate structure in the first conductive type MOS device region, the two lightly doped drains being corresponding to the spacers; and
   two second conductive type deep halo doped regions disposed in the second conductive type well by both sides of the gate structure in the first conductive type MOS device region, wherein each of the deep halo doped regions is disposed corresponding to and directly under one of the source/drain regions and one of the lightly doped drains, wherein no deep halo regions are disposed in the first conductive type well of the second conductive type MOS device region.

2. The CMOS transistor of claim 1, further comprising two second conductive type pocket doped regions disposed in the second conductive type well by both sides of the gate structure in the first conductive type MOS device region.

3. The CMOS transistor of claim 1, wherein the first conductive type is P type, and the second conductive type is N type.

4. The CMOS transistor of claim 1, wherein the two deep halo doped regions are heavily doped regions.

* * * * *